United States Patent [19]
Chan

[11] Patent Number: 5,126,163
[45] Date of Patent: Jun. 30, 1992

[54] METHOD FOR METAL ION IMPLANTATION USING MULTIPLE PULSED ARCS

[75] Inventor: Chung Chan, W. Newton, Mass.

[73] Assignee: Northeastern University, Boston, Mass.

[21] Appl. No.: 577,857

[22] Filed: Sep. 5, 1990

[51] Int. Cl.$^5$ ............................................... B05D 3/06
[52] U.S. Cl. ........................................ 427/38; 427/39; 427/37; 250/492.3
[58] Field of Search ........................... 427/38, 39, 37; 118/620; 250/492.2, 492.3

[56] References Cited

U.S. PATENT DOCUMENTS

| | | | |
|---|---|---|---|
| 4,764,394 | 8/1988 | Conrad | 427/38 |
| 5,013,578 | 5/1991 | Brown et al. | 427/37 |

FOREIGN PATENT DOCUMENTS

| | | |
|---|---|---|
| 0282467 | 9/1988 | European Pat. Off. |
| 62-274541 | 11/1987 | Japan |

OTHER PUBLICATIONS

"Transport of vacuum arc plasma through straight and curved magnetic ducts" J. Storer et al, J. Appl. Phys. 66 (11), Dec. 1, 1988, pp. 5245-5250.

Primary Examiner—Michael Lusignan
Assistant Examiner—Roy V. King
Attorney, Agent, or Firm—Weingarten, Schurgin, Gagnebin & Hayes

[57] ABSTRACT

A method and apparatus for implanting metal ions into the surface of a non-planar object. A pulsed arc source provides a plasma of high density metal ions to surround a target sample exclusively during a predetermined period in which an implanting voltage pulse is applied to the target sample. The pulsed arc source is subsequently interrupted slightly before termination of the implant voltage pulse such that each and every metal ion from the ion plasma is implanted into the target sample during a single implantation cycle. This process is cyclically repeated until a desired concentration of ions is implanted into the target sample.

13 Claims, 4 Drawing Sheets

METHOD FOR METAL ION IMPLANTATION USING MULTIPLE PULSED ARCS

FIELD OF THE INVENTION

This invention relates generally to the field of ion implantation and, more specifically, to a method and apparatus for implantation of metal ions via pulsed arcs.

BACKGROUND OF THE INVENTION

Ion implantation is a process by which atoms or groups of atoms are ionized to assume a net electrical charge by losing or gaining electrons so that the charged atoms can be excited to high speeds by an electrical potential and accelerated into a target sample. The target sample is bombarded with ions which are driven deeply into the surface thereof and distributed therein. This process is used to achieve an intimate mixing of incompatible materials to realize valuable new properties. Ion implantation is commonly used in the semiconductor industry for doping silicon to alter its electrical properties or in the treatment of metal, ceramic or polymeric surfaces to affect the hardness, optical properties, corrosion resistance, electrical conductivity, and other characteristics of the material.

Conventional ion implantation techniques utilize an ion source to accelerate a beam of ions toward a target sample for implantation therein. However, the use of an ion beam confines the implantation of ions to a line-of-sight region such that the target sample must be moved about in a steady, controlled manner during exposure to the ion beam in order to provide uniform implantation of all surfaces of the target sample. Such manipulation of the target sample, often provided via computer control techniques, can be very time consuming and expensive.

In order to overcome the problems associated with ion beam implantation methods, ion implantation has also been accomplished by generating a gaseous plasma of ions surrounding the target sample. For example, U.S. Pat. No. 4,764,394 discloses a method and apparatus for ion implantation utilizing a plasma ion source to create a steady state, gaseous plasma of ions to surround a target sample for implantation therein. Using the process of that patent, a negative voltage pulse is applied to the target sample to create an implant voltage which attracts and implants ions from the surrounding plasma into the target sample. Since plasma source ion implantation generates a plasma of ions surrounding the entire sample target for implantation therein, the process is not limited to line-of-sight implantation and therefore facilitates ion implantation of all exposed surfaces of a nonplanar target sample without manipulation thereof. The referenced U.S. patent also discloses the use of multiple electrical pulses applied to the target sample in rapid succession for performing a series of ion implantations until a desired concentration of implanted ions is achieved within the target sample.

Although the plasma source ion implantation process disclosed in U.S. Pat. No. 4,764,394 provides significant improvements in ion implantation of three-dimensional materials, it is impracticable to use this process for the implantation of metal ions because high density metal ions tend to precipitate from the steady state ion plasma between implant voltage pulses. These ions become deposited onto the surface of the target sample and form a thin film of metal surface coating thereon. The resultant metal surface coating is not distributed into the surface of the target sample, thereby creating a barrier to any subsequent implantation. Thus, present ion implantation methods designed for implantation of metal ions are limited to ion beam applications, necessarily embracing the inherent deficiencies associated therewith.

SUMMARY OF THE INVENTION

The present invention provides a novel apparatus and method for implanting metal ions into a target sample in a manner different from known plasma source ion implantation techniques. The invention is especially well-suited for providing conformable implantation of metal ions into non-planar objects, avoiding the requirement for expensive and complicated target manipulation apparatus associated with ion beam implantation.

In accordance with the present invention, which may be designated metal ion implantation using multiple pulsed arcs, a target sample is periodically surrounded by a metal ion plasma, exclusively during periods in which an implanting voltage pulse is applied to the target sample. Thus, an electric field is periodically generated adjacent to the target sample and a pulsed arc source provides a fully ionized plasma of high density metal ions, wherein ion droplets and macroparticles have been filtered, the ionized plasma surrounding the target sample slightly after introduction of the electric field. The electric field causes the metal ions to be instantaneously accelerated from the ion plasma toward the target sample and implanted therein. Subsequently, the pulsed arc source is interrupted slightly prior to termination of the implant voltage pulse so that each and every metal ion in the metal ion plasma is implanted into the target object during the period in which the electric field exists and the metal ion plasma surrounding the target sample is completely eliminated. This process can be cyclically repeated until the desired concentration of implanted ions is achieved.

It is important that the plasma of ions is completely eliminated prior to the termination of the implant voltage pulse in each implantation cycle. This distinguishing feature guarantees that the supply of metal ions is thoroughly depleted between implantation cycles preventing unwanted precipitation, deposition and/or sputtering of metal ions onto the surface of the target sample between implantation cycles. The present invention can be used to form specific compositions by modifying the timing sequence of each cycle or by varying the total time of the implantation process. Further, by altering the magnitude of the implant voltage pulse, or the density of ions in the metal ion plasma, the implant depth and implant density of the metal ion implantation process can be tailored to provide numerous aggregate materials.

The pulsed nature of the implantation voltage provides advantageous results for a number of reasons. First, the short duty cycle of the pulsed implant voltage eliminates surface damage to the target sample which would be caused by sustained high voltage arcing. Secondly, by selecting the implant voltage pulse width to be of limited duration, spatial uniformity and implantation depth uniformity is provided and the plasma forming around the target sample can be prevented from expanding during the voltage pulse, wherein unlimited expansion would permit the plasma to contact either the vacuum chamber wall or other adjacent objects. Thirdly, the metal ions are accelerated by a concentrated electric field sheath instead of an extended vacuum electric field, so as to minimize line-of-sight deposition caused by instantaneous acceleration of the metal ions emerging from the arc source to the target sample. Finally, an extended DC vacuum electric field generated by a steady state implant voltage may affect the operation of multiple arc sources; however, it is understood that the present invention does not preclude the use of a DC implant voltage at the target sample for ion implantation.

In accordance with the present invention, metal ion implantation may be performed on complex, non-planar, three dimensional objects without any manipulation thereof. Further, the ion implantation process and apparatus of the present invention can be utilized to simultaneously trigger an array of pulsed arc sources to accomodate the metal ion implantation of a very large target sample or a multiplicity of target samples. The present invention also permits the implantation of any combination of ions through the use of different metallic and non-metallic elements, including gaseous ions in the steady-state plasma, such that sequential implantation of multiple ion species (metal and/or non-metal) can be conducted to create a diverse assortment of multilayered alloys.

The process of the present invention provides significant enhancement to surface hardening and corrosion resistance characteristics of various metals used for tools, airplane parts and machine parts, etc. Commercial applications also include surface treatment of conducting ceramics and multilayer thin film magnetic materials as well as optical devices and alloys used for artificial joint implants.

DESCRIPTION OF THE DRAWINGS

Further objects, features and advantages of the present invention will be apparent from the following detailed description, taken in conjunction with the accompanying drawings, wherein.

DETAILED DESCRIPTION OF THE INVENTION

Figure 1:
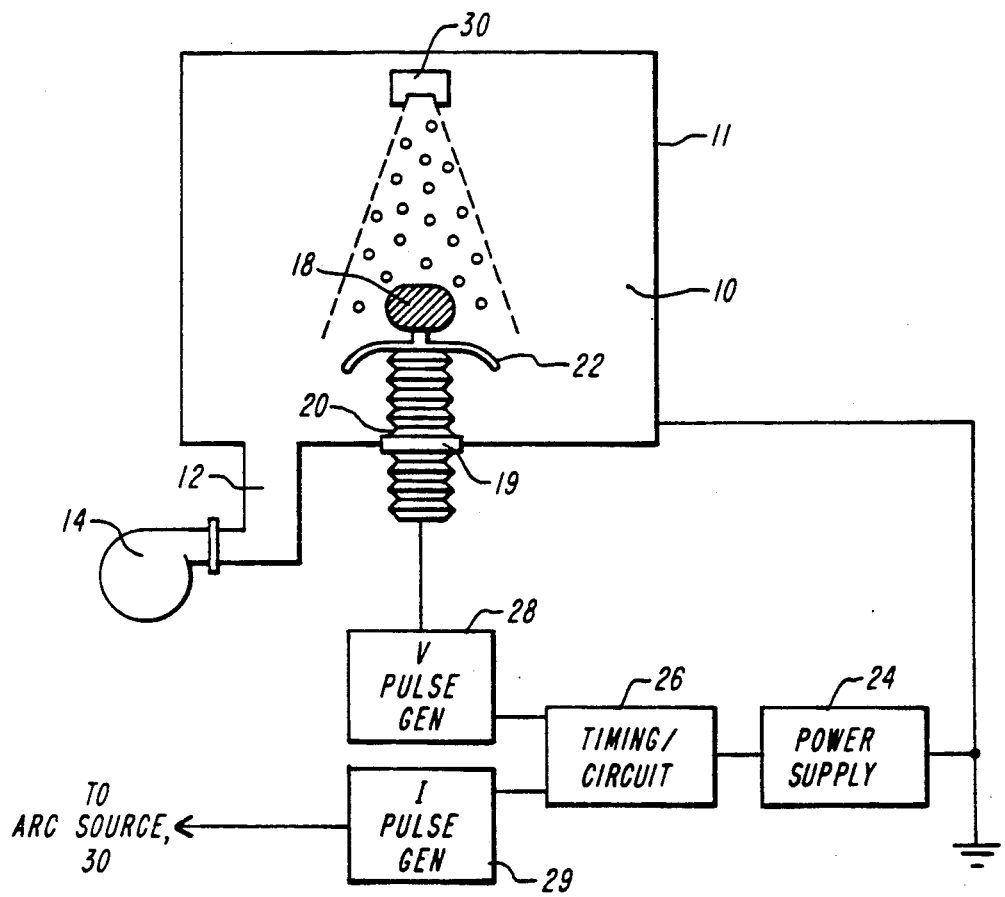
FIG. 1 is a simplified cross sectional view of an ion implantation chamber and associated apparatus in accordance with the present invention.

An ion implantation apparatus in accordance with the present invention is shown in FIG. 1. The apparatus of the invention generally comprises an implantation chamber 10 including at least one target support electrode 20 and at least one pulsed arc source 30.

The implantation chamber 10 comprises conductive walls 11, providing a sealed work environment for implantating metal ions into a target sample 18 disposed therein. At least one target support electrode 20 is mounted through a conductive wall 11 of the chamber 10 to provide an electrical path for applying implantation voltage to the target sample 18 within the chamber 10. The conductive walls 11 are connected to ground potential, as shown, to prevent sparking or arcing between the target support electrode 20 and the chamber walls 11.

The target support electrode 20 may be a fixed post or an adjustable shaft as illustrated in FIG. 1, providing the capability to adjust the distance between the target sample 18 and the pulsed arc source 30. A platform 22 is mounted at the end of the target support electrode 20 within the chamber 10 for positioning the target sample 18 substantially in the center of the chamber 10. An insulated gromet 19 provides electrical isolation between the electrode 20 and the ground potential of the chamber walls 11. The target support electrode 20 may also be covered with electrically insulated material or a flexible electrical shielding (not shown) providing a protective covering to prevent ion implantation therein.

The ion implantation apparatus of the present invention also includes a vacuum pump 14 connected to the implantation chamber 10 via an exhaust port 12. The vacuum pump 14 provides the capability to evacuate the implantation chamber 10 to produce a vacuum or pressure-controlled, contamination-free environment within the implantation chamber 10 depending on the application of the present ion implantation process, as will be discussed.

At least one pulsed arc source 30 is provided within the chamber 10 for introducing a fully ionized metal plasma into the interior of the implantation chamber 10. As one example for providing an ionized metal plasma, a vaporized metallic source plasma may be injected into the chamber 10 via the arc source 30, wherein the arc source 30 ionizes the plasma and filters droplets and macroparticles in a conventional manner to provide an ionized metal plasma surrounding the target sample 18 for implantation therein.

The present ion implantation apparatus further comprises an electronic circuit for producing voltage and current pulses at the target sample 18 and the pulsed arc source 30, respectively. One example of a circuit suitable for this purpose is shown in FIG. 1 including a power supply 24 coupled to a timing circuit 26. The timing circuit 26 provides precise control signals to a high voltage pulse generator 28 and to a current pulse generator 29, each individually coupled to the target support electrode 20 and to the arc source 30, respectively, for providing appropriately timed periodic pulses of implant voltage at the target sample 18 and ionized metal plasma within the chamber 10.

Ion implantation in accordance with the present invention can generally be achieved by at least two different approaches, as will presently be described. A first approach contemplates ion implantation in a relatively small-scale chamber 10 with small target samples where problems associated with line-of-sight acceleration of the metal ion plasma from the arc source are non-existant. After placing a target sample 18 on the platform 22 of the target support electrode 20, the chamber 10 is evacuated via pump 14 to prevent the influences of atmosphere from affecting the processes within the chamber. Once the chamber 10 has been completely evacuated, a high negative voltage pulse is generated by the voltage pulse generator 28 and applied to the target sample 18 via the target support electrode 20 to form an electric field sheath concentrated about the target sample 18. Slightly after the implant voltage is applied to the target sample 18, the timing circuit 26 triggers the current pulse generator 29 and, in turn, the arc source 30 to generate a concentrated metal ion plasma within the implantation chamber 10. These ions are instantaneously accelerated toward the target sample 18 by the electric field at the target sample 18 and implanted therein.

This implantation cycle is terminated by first terminating the current pulse at the arc source 30 and subsequently terminating the implant voltage pulse at the target sample 18. Thus, the relationship between the implant voltage pulse and the arc source current pulse is such that the current pulse expires just prior to the implant voltage pulse so that generation of the metal ion plasma is discontinued prior to elimination of the electric field surrounding the target sample 18. By terminating the implant voltage pulse after turning off the arc source current pulse, the electric field at the target source 18 remains for a short period after discontinuation of the source plasma so that any ions present in the chamber 10 are implanted into the target sample 18. The supply of ions in the chamber 10 is, therefore, completely depleted, preventing any precipitation of ions onto the target sample during idle periods in which the implant voltage is not applied to the target sample 18.

Figure 2A:
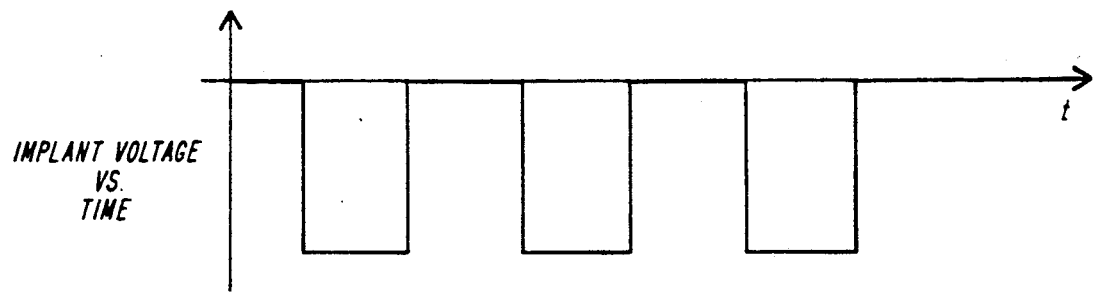
FIGS. 2A, 2B and 2C are timing sequence diagrams showing the overlap of target implantation voltage, pulsed arc ion source current, and implanted ion current for one embodiment of the present invention.
Figure 2B:
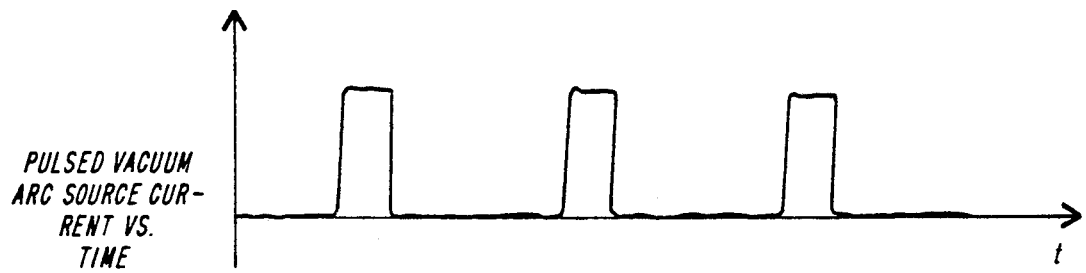
Figure 2C:
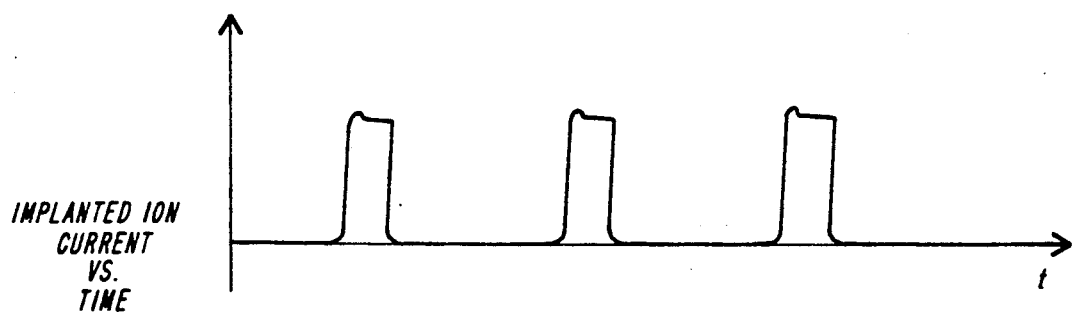

The process described hereinabove constitutes a single implantation cycle which can be cyclically repeated until the desired concentration of implanted ions is achieved. The principles of operation of the process of the present invention can be more clearly understood by reference to the timing diagrams of the FIGS. 2A-2C. FIG. 2A shows multiple pulses of negative potential applied to the target sample 18 for providing an implant voltage and resultant electric field. FIG. 2B shows the current pulses through the pulsed arc source 30 wherein the arc source 30 provides a plasma of metallic ions to surround the target sample for a predetermined period of time beginning slightly after the implant voltage is applied to the target sample 18, and terminating slightly before the implant voltage is removed therefrom. FIG. 2C illustrates the implant ion current, substantially shadowing the pulsed vacuum arc source current, showing a small current spike caused by the initial implantation of ions onto the target sample 18, decaying to a steady state current as the electric field generated by the implant voltage propagates through the implantation chamber 10, causing implantation of ions into the target sample at a substantially constant rate.

An alternative approach to the present metal ion implantation method is also contemplated in which a relatively large target sample is placed inside a large implantation chamber 10, such that the separation between the target sample and the arc source is correspondingly increased. This alternative approach compensates for line-of-sight acceleration of the ion plasma from the arc source 30 by allowing the ion plasma to expand radially to cover a large area, taking into account the time necessary for the ions to travel from the arc source 30 to the target sample 18.

Figure 3A:
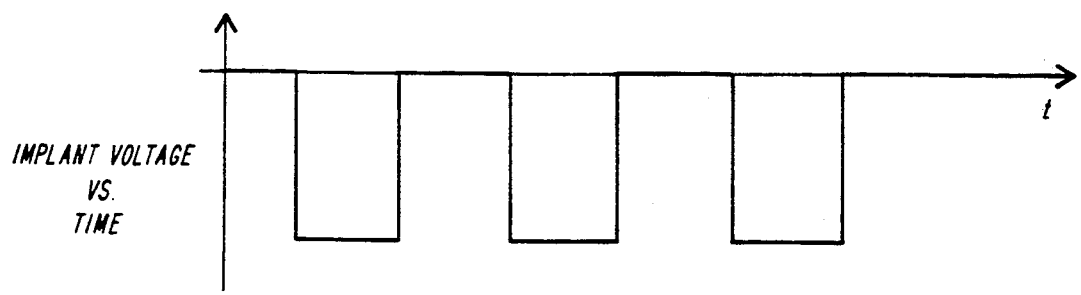
FIGS. 3A, 3B and 3C are timing sequence diagrams showing an alternative timing sequence for a second embodiment of the ion implantation process of the present invention.
Figure 3B:
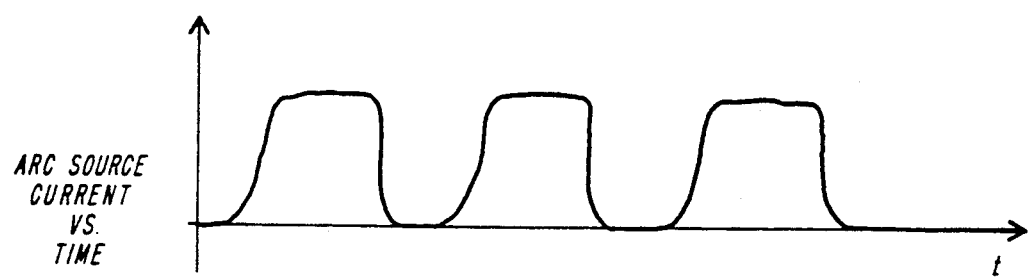
Figure 3C:

As shown in FIGS. 3A-3C, and in particular FIG. 3B the timing sequence of this alternative approach is such that the pulsed arc source 30 is triggered prior to application of the implant voltage at the target sample 18, thereby allowing the plasma of ions to travel toward, and expand around, the target sample for a short period of time just prior to the application of each implant voltage pulse, as shown in FIG. 3A. This alternative approach allows for the use of shorter implantation voltage pulses so that the electric field sheath generated at the target sample 18 cannot expand out to the arc source 30, preventing sputtering thereon. It is essential to this alternative approach, however, that the ion plasma is not permitted to reach the point of contacting the target sample 18 prior to application of the implant voltage so that surface coating via precipitation of metal ions onto the target sample 18 is prevented prior the commencement of ion implantation via the electric field generated by the implant voltage.

Figure 4:
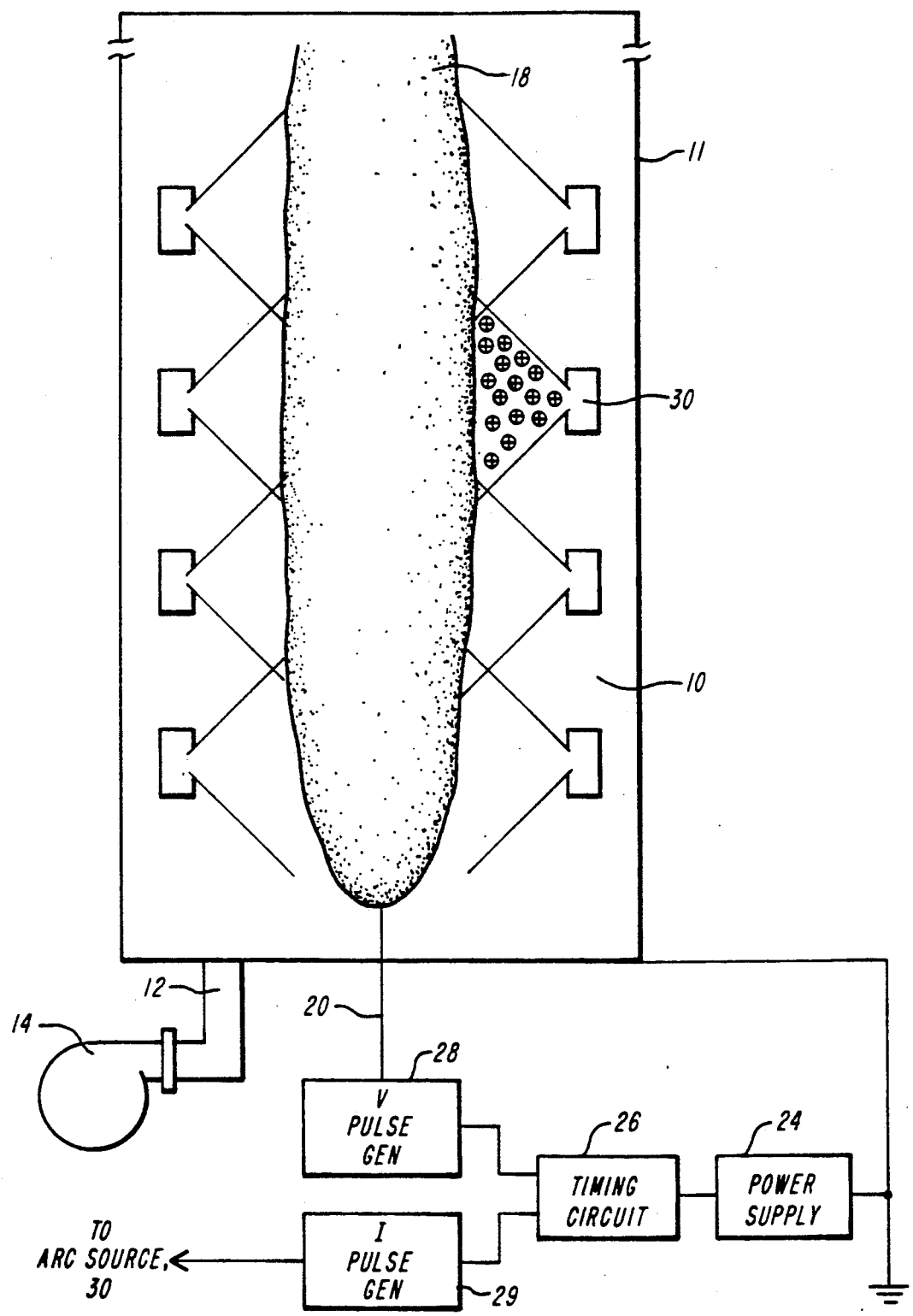
FIG. 4 is a top view of a large area pulsed arc ion implantation chamber in accordance with the present invention.

The ion implantation apparatus and method thereof presented herein can be utilized to perform metal ion implantation via a plurality of pulsed arc sources. For example, FIG. 4 illustrates a large area pulsed vacuum arc ion implantation apparatus for the implantation of large target samples. In this embodiment, an array of arc sources 30 are simultaneously or sequentially pulsed via a current pulse generator 29 to generate a metal ion plasma during periods in which an implant voltage from a voltage pulse generator 28 is applied to the target sample 18, as previously described. The large area pulsed arc ion implantation apparatus of FIG. 4 can also be used for ion implantation of a plurality of smaller target samples 18 by including a plurality of target support electrodes 20.

An illustrative example of the present implantation process, demonstrating the implatation of a gold surface target sample with cobalt ions for surface hardening purposes, will presently be described. An implant voltage of minus 100 Kv is applied to the target sample in pulses of 50 microseconds duration. Assuming a 5% duty cycle, which may be varied as desired, a 950 microsecond idle period between voltage pulses is provided, yielding an implant voltage frequency of 1 KHz. Meanwhile, the pulsed vacuum arc source provides a plasma of cobalt ions adjacent to the target sample having a density of approximately $10^{11}$ ions/cm$^3$. By exposing the target sample for a pulsed implantation period of 100 seconds, these parameters will yield an implantation layer approximately 0.1 micrometer thick having a density slightly less than $10^{16}$ ions/cm$^2$.

It will be appreciated that the present invention is not limited to the particular embodiments set forth herein and that various changes may be made to the invention such that all matter herein described or shown in the accompanying drawings is to be interpreted as illustrative only, embracing all modified forms thereof as may be within the scope of the following claims.

I claim:

1. A method for implanting ions into a surface of a target sample within an ion implantation chamber, comprising the steps of:
    (a) applying to the target sample a voltage potential relative to the inner surface of the chamber, thereby providing an implant voltage and electric field;
    (b) applying to an arc source a current operative for generating a plasma of metal ions to surround said target sample, whereby the ions are accelerated toward the target sample by the electric field provided at the target sample and implanted therein;
    (c) terminating the application of the current to the arc source, whereby the generation of metal ion plasma is discontinued; and
    (d) terminating the application of the implant voltage after the arc current is terminated, whereby said plasma of ions surrounding said target sample is completely depleted due to implantation into the target sample.

2. The method of claim 1 further including the step of: cyclically repeating said steps until a predetermined concentration of ions is implanted into the surface of said target sample.

3. The method of claim 1 further including the step of:
   evacuating said ion implantation chamber to provide a controlled implantation environment therein.

4. The method of claim 3 wherein said evacuation step provides a vacuum environment within said chamber.

5. The method of claim 1 wherein the generated plasma of metal ions is selected from the group consisting of cobalt, platinum, titanium, and gold.

6. The method of claim 1 wherein:
   the period of time between which the implant voltage is applied and terminated is greater than 20 microseconds and less than 80 microseconds; and
   the period of time between which the arc current is applied and terminated is greater than 10 microseconds and less than 70 microseconds.

7. The method of claim 1 wherein the implant voltage applied is greater than 20 kv and less than 200 kv in magnitude.

8. The method of claim 1, wherein said step of applying an implant voltage generates an electric field sheath concentrated about said target sample.

9. A method for implanting ions into a surface of a target sample, comprising the steps of:
   applying an implant voltage pulse to said target sample for a first predetermined period of time, said period of time being governed by a timing circuit; and
   generating a plasma of metal ions to surround said target sample for the second predetermined period of time, said period of time being governed by a timing circuit wherein;
   said plasma of ions surrounds, but does not come into contact with, said target sample prior to application of said implant voltage thereto, said ions being accelerated toward and implanted into said target sample by said implant voltage, and further wherein;
   said second predetermined period of time terminates prior to termination of said first predetermined period of time such that said plasma of ions generated during said second predetermined period of time is completely depleted by said implant voltage during said first predetermined period of time, said terminations being defined by the timing circuit.

10. The method of claim 9, further including the step of:
    cyclically repeating said steps of applying an implant voltage pulse and generating a plasma of ions until a predetermined concentration of ions is implanted into the surface of said target sample.

11. The method of claim 9, further including the steps of:
    positioning said target sample within an implantation chamber; and
    evacuating said ion implantation chamber to provide a controlled implantation environment therein.

12. The method of claim 9, wherein the generated plasma of ions is a metal selected from the group consisting of cobalt, platinum, titanum, and gold.

13. The method of claim 9, wherein said step of applying an implant voltage generates an electric field sheath concentrated about said target sample.

* * * * *

UNITED STATES PATENT AND TRADEMARK OFFICE
CERTIFICATE OF CORRECTION

PATENT NO. : 5,126,163
DATED : June 30, 1992
INVENTOR(S) : Chung Chan

It is certified that error appears in the above—identified patent and that said Letters Patent is hereby corrected as shown below:

Column 6, line 26, "implatation" should read --implantation--.

Column 8, line 1, "by a" should read --by the--.

Signed and Sealed this

Twenty-eighth Day of December, 1993

Attest:

BRUCE LEHMAN

*Attesting Officer*   Commissioner of Patents and Trademarks